United States Patent
Li et al.

(10) Patent No.: US 11,419,278 B2
(45) Date of Patent: Aug. 23, 2022

(54) LED LIGHT SOURCE FOR SUPPLEMENTAL LIGHTING FOR PLANTS AND LAMP WITH LIGHT SOURCE

(71) Applicant: HANGZHOU HANHUI OPTOELECTRONIC TECHNOLOGY CO., LTD., Hangzhou (CN)

(72) Inventors: Xuke Li, Hangzhou (CN); Xiang Pan, Hangzhou (CN)

(73) Assignee: HANGZHOU HANHUI OPTOELECTRONIC TECHNOLOGY CO., LTD., Hangzhou (CN)

(*) Notice: Subject to any disclaimer, the term of this patent is extended or adjusted under 35 U.S.C. 154(b) by 64 days.

(21) Appl. No.: 17/043,669

(22) PCT Filed: Nov. 1, 2019

(86) PCT No.: PCT/CN2019/114978
§ 371 (c)(1),
(2) Date: Sep. 30, 2020

(87) PCT Pub. No.: WO2020/103671
PCT Pub. Date: May 28, 2020

(65) Prior Publication Data
US 2021/0015052 A1    Jan. 21, 2021

(30) Foreign Application Priority Data

Nov. 22, 2018 (CN) .................. 201811399092.X
Nov. 22, 2018 (CN) .................. 201811399094.9

(Continued)

(51) Int. Cl.
*A01G 7/04*       (2006.01)
*H01L 25/075*    (2006.01)
*H01L 33/50*      (2010.01)

(52) U.S. Cl.
CPC .......... *A01G 7/045* (2013.01); *H01L 25/0753* (2013.01); *H01L 33/504* (2013.01)

(58) Field of Classification Search
CPC ...... H01L 33/504; H01L 33/502; H01L 33/50
See application file for complete search history.

(56) References Cited

U.S. PATENT DOCUMENTS

2013/0318869 A1* 12/2013 Aikala .................. F21K 9/64
                                                          47/58.1 LS
2014/0353704 A1   12/2014 Kamikawa
(Continued)

FOREIGN PATENT DOCUMENTS

CN     103220902 A     7/2013
CN     103672493 A     3/2014
(Continued)

*Primary Examiner* — Andrew J Coughlin
(74) *Attorney, Agent, or Firm* — Bayramoglu Law Offices LLC

(57) ABSTRACT

An upside-down type LED light source for supplemental lighting for plants includes a substrate, an LED chip, a first glue powder layer, and a second glue powder layer; the LED chip is mounted on one surface of the substrate; the LED chip being a blue LED chip; the first glue powder layer is disposed between the LED chip and the substrate, and the LED chip is covered by the second glue powder layer; the LED chip is fixed on the substrate through the first glue powder layer, wherein the first glue powder is a mixture of a glue and red phosphors; and the second glue powder layer covers the LED chip and completely wraps the LED chip; the second glue powder layer is one of a mixture of the glue and yellow phosphors, and a mixture of the glue and infrared phosphors.

19 Claims, 2 Drawing Sheets

(30) Foreign Application Priority Data

Nov. 22, 2018 (CN) .......................... 201811400237.3
Nov. 22, 2018 (CN) .......................... 201811400238.8

(56) References Cited

U.S. PATENT DOCUMENTS

| | | | |
|---|---|---|---|
| 2015/0014720 A1* | 1/2015 | Tien | H01L 33/486 |
| | | | 257/98 |
| 2015/0070871 A1* | 3/2015 | Chen | F21K 9/232 |
| | | | 362/84 |
| 2017/0238390 A1* | 8/2017 | Yamakawa | F21K 9/64 |
| | | | 315/294 |
| 2021/0015052 A1* | 1/2021 | Li | F21V 9/40 |

FOREIGN PATENT DOCUMENTS

| | | | |
|---|---|---|---|
| CN | 103727411 | A | 4/2014 |
| CN | 103915546 | A | 7/2014 |
| CN | 103915552 | A | 7/2014 |
| CN | 102917493 | B | 3/2015 |
| CN | 105202484 | A | 12/2015 |
| CN | 105405954 | A | 3/2016 |
| CN | 109538952 | A | 3/2019 |
| CN | 109538979 | A | 3/2019 |
| CN | 109644718 | A | 4/2019 |
| CN | 109854979 | A | 6/2019 |
| JP | 2010029098 | A | 2/2010 |
| JP | 2016170968 | A | 9/2016 |
| WO | 2013190962 | A1 | 12/2013 |
| WO | 2014119313 | A1 | 8/2014 |
| WO | 2017001261 | A1 | 1/2017 |

\* cited by examiner

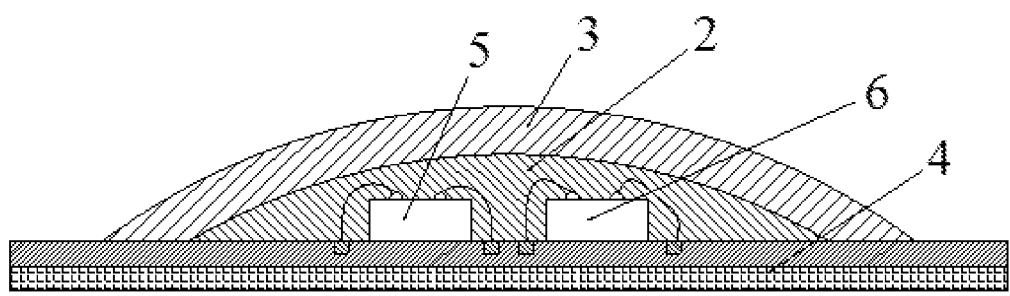

LED LIGHT SOURCE FOR SUPPLEMENTAL LIGHTING FOR PLANTS AND LAMP WITH LIGHT SOURCE

CROSS REFERENCE TO RELATED APPLICATION

This application is the national stage entry of International Application No. PCT/CN2019/114978, filed on Nov. 1, 2019, which is based upon and claims priority to Chinese Patent Application No. 201811400238.8, filed on Nov. 22, 2018; Chinese Patent Application No. 201811399092.X, filed on Nov. 22, 2018; Chinese Patent Application No. 201811400237.3, filed on Nov. 22, 2018; and Chinese Patent Application No. 201811399094.9, filed on Nov. 22, 2018, the entire contents of which are incorporated herein by reference.

TECHNICAL FIELD

The present disclosure relates to an LED light source for supplemental lighting for plants and a lamp with the light source, and pertains to the technical field of facility agriculture lighting.

BACKGROUND

According to the photophysiological characteristics of plants, light radiation has a regulatory effect on photosynthesis, growth and development, morphogenesis, and metabolism of plants. Different wavelengths of light irradiated on plants have different physiological effects on plants, and thus the weight of light of different wavelengths in photosynthesis is also different and varies depending on plant species and growth stages. Chlorophyll is responsible for absorption, transmission and transformation of light energy in a plant body, while carotenoids have two major functions of light energy capture and photoprotection. They play a very important role in photosynthesis. Chlorophyll a has maximum absorption peaks of 410 nm, 430 nm and 660 nm; and chlorophyll b has maximum absorption peaks of 430 nm, 455 nm and 640 nm. Carotenoids are important accessory pigments, and the light energy they absorbed is just complementary to that absorbed by chlorophyll and thus can help chlorophyll receive light energy. Carotenoids have an absorption band of the blue-violet light region from 400 nm to 500 nm, leucocyan has a maximum absorbance in the orange-red light region, and phycoerythrobilin has a maximum absorbance in the green light region.

The influence of light quality in lighting conditions, especially the ratio (R/FR) of red light (600 nm-700 nm, R) to far-red light (700 nm-800 nm, FR) in the spectrum, has attracted increasing attention. The ratio (R/FR) of red light to far-red light in the spectrum has an important influence on the regulation of gibberellin (CA) content in plants, plant morphogenesis, and plant height adjustment. Scientists adjust morphology of plants by artificially controlling light quantum flux density of red light (R) or far-red light (FR) in the plant growth environment to change the ratio of R/FR. When the R/FR ratio is larger, internodes spacing of the plant become smaller and stunted; on the contrary, when the R/FR ratio is smaller, the plant tends to elongate.

Green plants need visible light for photosynthesis during their growth. However, as is well known, visible light is a kind of composite light, and different plants have different requirements for different colors of visible light during their growth process.

Increasing studies have shown that if light of different colors are mixed and irradiated in different proportions, it would help to the growth of plants.

However, in terms of specific implementation form, in practical applications, the number of red LEDs or far-red LEDs in the light source needs to be increased to achieve adjustment of the R/FR ratio, so as to achieve the purpose of controlling the morphology of the plant; and the number of green LEDs needs to be increased to make up for deficiencies in the spectrum. Generally, multiple LED light sources of different colors are combined to achieve a light environment with various light qualities in different proportions, which is extremely inconvenient for users. If the proportions of LED light sources of different colors are wrong in the process of combination of LED light sources, it is difficult to achieve the purpose of increasing plant yield and quality.

LED light sources in the prior art are described in CN 201180055432.7, CN 201210414873.8, and CN 201210375582.2.

However, in all the above three patents, blue light is used to excite red phosphors and emit red and blue light for plant photosynthesis. However, it is necessary to add ultraviolet light emitting diodes, green light emitting diodes or infrared light emitting diodes to achieve the supplementation of ultraviolet, green and near-infrared light; as a result, the following shortcomings are brought about:

Firstly, the lack of important components such as ultraviolet, green, or infrared light in the spectrum will cause serious deficiencies in the photomorphogenesis of plants, which will affect plant growth, development and quality;

Secondly, the deficiencies in biologically effect radiation spectrum of plants is to be make up and photosynthesis or adjust the ratio of light qualities is enhanced by the addition of ultraviolet light emitting diodes, green light emitting diodes or infrared light emitting diodes, these greatly increases input cost for LED light sources, for example, the prices of red and ultraviolet light LED chips are 5-8 times that of blue LED chips;

Thirdly, due to the addition of ultraviolet light emitting diodes, green light emitting diodes or infrared light emitting diodes, of which light efficiency is low, cost for subsequent operation and maintenance is greatly increased, cost for heat dissipation is increased accordingly, and thus energy consumption is greatly increased;

Fourthly, in the photomorphogenesis, the proportions of the spectrum of ultraviolet light (280 nm-400 nm) and infrared light (700 nm-800 nm) are relatively low in the biologically effect radiation spectrum (280 nm-800 nm) of plants, and an LED has a small illumination angle, and thus it is difficult to meet the requirements for design of spectral uniform illumination. Under the premise of a small number of infrared or ultraviolet LED light source, it is difficult to uniformly arrange infrared or ultraviolet LED light sources, or even if the diffusion angle directivity of infrared or ultraviolet LED light sources is optimally adjusted, color mixing of ultraviolet, infrared, red and blue light is not sufficient, and thus uneven spectral distribution is likely to occur.

SUMMARY

It is an object of the present disclosure to provide an LED light source for supplemental lighting for plants and a lamp with the light source, which emits light formulation with different spectral compositions of a fixed proportion in a single LED lighting device, and is thus convenient for manufacturing, cost control, and use by the user.

The technical problem is solved in the present disclosure by the following technical solution: an LED light source for supplemental lighting for plants including a substrate, an LED chip, a first glue powder layer, and a second glue powder layer; wherein, the LED chip is mounted on one surface of the substrate; the LED chip being a blue LED chip;

the LED chip is covered thereon with the first glue powder layer and the second glue powder layer;

the LED chip is fixed on the substrate through the first glue powder layer which is a mixture of glue and red phosphors; and the second glue powder layer covers the first glue powder layer and completely wraps the first glue powder layer; the second glue powder layer being a mixture of glue and yellow phosphors; or the second glue powder layer being a mixture of glue and infrared phosphors.

the technical problem is also solved in the present disclosure by the following technical solution: an LED light source for supplemental lighting for plants including a substrate, an LED chip, and a first glue powder layer; wherein, the LED chip is mounted on one surface of the substrate; the LED chip being a blue LED chip;

the LED chip is covered thereon with the first glue powder layer;

the LED chip is fixed on the substrate through the first glue powder layer which is a mixture of glue, red phosphors and yellow phosphors, or a mixture of glue, red phosphors, and infrared phosphors.

The technical problem is also solved in the present disclosure by the following technical solution: an LED device for supplemental lighting for plants including a substrate, an LED chip, a first glue powder layer, and a second glue powder layer; wherein, the LED chip is mounted on one surface of the substrate; the LED chip including one of a blue LED chip and an ultraviolet LED chip, or a combination thereof;

the LED chip is covered thereon with the first glue powder layer and the second glue powder layer;

the LED chip is fixed on the substrate through the first glue powder layer which is a mixture of glue and red phosphors; and the second glue powder layer covers the first glue powder layer and completely wraps the first glue powder layer; the second glue powder layer being a mixture of glue and infrared phosphors; or the second glue powder layer being a mixture of glue and yellow phosphors.

The technical problem is also solved in the present disclosure by the following technical solution: an LED device for supplemental lighting for plants including a substrate, an LED chip, and a first glue powder layer; wherein, the LED chip is mounted on one surface of the substrate; the LED chip including one of a blue LED chip and an ultraviolet LED chip, or a combination thereof;

the LED chip is covered thereon with the first glue powder layer;

the LED chip is fixed on the substrate through the first glue powder layer which is a mixture of glue, red phosphors and yellow phosphors, or a mixture of glue, red phosphors, and infrared phosphors.

The technical problem is also solved in the present disclosure by the following technical solution: an upside-down type LED light source for supplemental lighting for plants including a substrate, an LED chip, a first glue powder layer, and a second glue powder layer; wherein, the LED chip is mounted on one surface of the substrate; the LED chip being a blue LED chip;

the first glue powder layer is disposed between the LED chip and the substrate, and the LED chip is covered thereon with the second glue powder layer;

the LED chip is fixed on the substrate through the first glue powder layer which is a mixture of glue and red phosphors; and the second glue powder layer covers the LED chip and completely wraps the LED chip; the second glue powder layer being a mixture of glue and yellow phosphors; or the second glue powder layer being a mixture of glue and infrared phosphors.

The technical problem is also solved in the present disclosure by the following technical solution: an upside-down type LED device for supplemental lighting for plants including a substrate, an LED chip, a first glue powder layer, and a second glue powder layer; wherein, the LED chip is mounted on one surface of the substrate; the LED chip being a blue LED chip;

the first glue powder layer is disposed between the LED chip and the substrate, and the LED chip is covered thereon with the second glue powder layer;

the LED chip is fixed on the substrate through the first glue powder layer which is a mixture of glue and yellow phosphors or a mixture of glue and infrared phosphors; and the second glue powder layer covers the LED chip and completely wraps the LED chip; the second glue powder layer being a mixture of glue and red phosphors.

The technical problem is also solved in the present disclosure by the following technical solution: a lamp including the LED light source for supplemental lighting for plants described above.

The present disclosure has the following advantageous effects: With the LED light source or device for supplemental lighting for plants according to the present disclosure, the red phosphors and yellow phosphors are excited by the blue LED chip, which not only allows formation of a full spectrum, but also outstands the light formulation of characteristic for photosynthesis of plants. Thereby, the light formulation for plants achieved by a combination of multiple LED chips such as a red LED chip, a blue LED chip, an infrared LED chip, an ultraviolet LED chip, and a green LED chip in the prior art is changed. Consequently, input cost for LED chips, circuit and heat dissipation device is greatly reduced.

BRIEF DESCRIPTION OF THE DRAWINGS

FIG. 1 is a schematic structural view of an LED light source for supplemental lighting for plants according to Embodiments 1-5 of the present disclosure;

FIG. 2 is a schematic structural view of an LED light source for supplemental lighting for plants according to Embodiments 6-10 of the present disclosure;

FIG. 3 is a schematic structural view of an LED light source for supplemental lighting for plants according to Embodiments 11-13 of the present disclosure;

Figure 4:
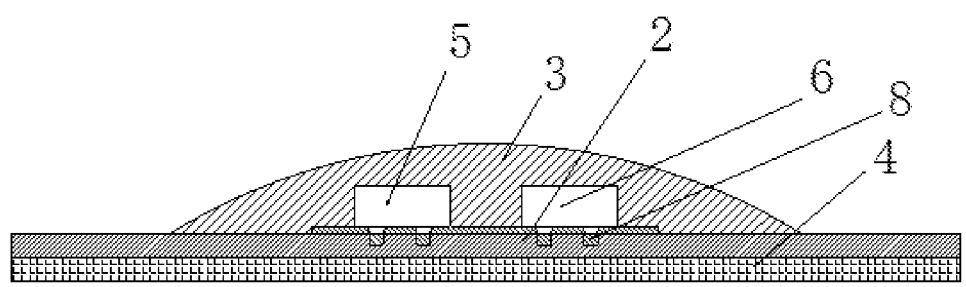
FIG. 4 is a schematic structural view of an LED light source for supplemental lighting for plants according to Embodiments 14-16 of the present disclosure.

Reference numerals include: 1—LED chip; 2—first glue powder layer; 3—second glue powder layer; 4—substrate; 5—ultraviolet LED chip; 6—blue LED chip; 7—PCB; 8—conductive circuit.

DETAILED DESCRIPTION OF THE EMBODIMENTS

The technical solution of the present disclosure will be further described below with reference to the embodiments and the drawings.

Embodiment 1

This embodiment provides an LED light source for supplemental lighting for plants, including a substrate, an LED chip, a first glue powder layer, and a second glue powder layer.

The LED chip is any one selected from the group consisting of: semiconductor light emitting diode; organic light emitting diode (OLED); quantum dot light emitting diode (QLED); and micro light emitting diode (Micro-LED).

The LED chip is disposed on the substrate, and preferably, the substrate is a PCB. The LED chip is mounted on one surface of the substrate, and a heat dissipation device, such as a heat dissipation base and the other members, is mounted on the other surface of the substrate, to dissipate the heat generated during the operation of the LED chip, so that the LED chip maintains a better operation temperature and operates in a stable state, and thus has a long service life.

The LED chip may be a blue LED chip, that is, the LED chip is capable of generating blue light of 400 nm to 480 nm.

The LED chip is covered thereon with the first glue powder layer and the second glue powder layer; in this embodiment, the LED chip is fixed on the substrate through the first glue powder layer which is a mixture of glue and red phosphors, wherein a weight ratio of the glue to the red phosphors is 100:10-150, and a weight ratio of 100:50 or 100:100 can be selected as a preferred embodiment.

The red phosphors are excited by blue light emitted by the LED chip to emit red light with a luminescence peak falling in a red light wavelength range of 605 nm to 680 nm.

The second glue powder layer covers the first glue powder layer and completely wraps the first glue powder layer; in this embodiment, the second glue powder layer is a mixture of glue and yellow phosphors, wherein a weight ratio of the glue to the yellow phosphors is 100:10-30, and preferably, the weight ratio of the glue to the yellow phosphors is 100:20.

Namely, since yellow phosphors are incorporated as well as the yellow phosphors is excited by blue light, green light with a wavelength of 500 nm to 560 nm and infrared light can be generated. Green light is capable of adjusting visual sense and photosynthesis, and infrared light is capable of adjusting the photomorphogenesis of plants.

In this embodiment, control of the weight ratio of the glue to the red phosphors in the first glue powder layer, as well as the thickness of the first glue powder layer; and control of the weight ratio of the glue to the yellow phosphors in the second glue powder layer, as well as the thickness of the second glue powder layer allow the ratio of photon flux densities of red light (600 nm-680 nm):blue light (420 nm-480 nm):infrared light:green light:ultraviolet light to be 70-90:10-30:1-30:5-20:0.01-1.

Preferably, the thickness of the first glue powder layer can be 0.1 mm-0.5 mm, and the thickness of the second glue powder layer can be 0.1 mm-0.9 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The yellow phosphor is one of yellow phosphors such as silicate yellow phosphor, aluminate yellow phosphor, nitride and oxynitride phosphors, or a combination thereof.

The red phosphor is one of YAGG, YAGG:$Ce^{3+}$, YAG:$Eu^{2+}$, nitride red phosphor, $Mn^+$ doped $K_2SiF_6$ and $K_2SnF_6$ deep red phosphor, or a combination thereof.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Compared with the prior art, the combination of red phosphors and yellow phosphors is excited by the blue LED chip, which not only allows formation of a full spectrum, but also outstands the light formulation of characteristic for photosynthesis of plants, thereby changing the light formulation achieved by a combination of multiple chips such as a red LED chip, a blue LED chip, an infrared LED chip, an ultraviolet LED chip, and a green LED chip in the prior art. Consequently, input cost for LED chips, circuit and heat dissipation device is greatly reduced (the price of the red LED chip, infrared LED chip, and green LED chip is much higher than that of the blue LED chip, and their luminous efficiency is very low);

In addition, the light formulation of the LED light source for supplemental lighting for plants according to the present disclosure is more uniform, and the beam angle of the light source is controllable. However, an LED for supplemental lighting for plants in the prior art, in which a large numbers of red LED chips and a small numbers of infrared LED chips and green LED chips are used, is difficult to achieve uniform distribution of light qualities.

The LED light source for supplemental lighting for plants according to the present disclosure has a longer service life and lower cost for heat dissipation. The combination of red phosphors and yellow phosphors is excited by the blue LED chip, rather than use of red LED chips, infrared LED chips, and green LED chips, thereby reducing greatly power of light source for plant growth. In addition, the circuit design is simplified (The different operating voltage drops of the blue LED, red LED chip, infrared LED chip, and green LED chip make the circuit complicated. Only the blue LED chip is used to excite the red phosphors and yellow phosphors to achieve the required spectrum, and thereby the circuit design is simplified.), the amount of capacitors used is reduced, the cost for circuit is low, and the service life is greatly extended.

The light source according to the present disclosure in which the red phosphors and yellow phosphors are excited by the blue LED chip was used as a light formulation to irradiate lettuce. The result shows that: The soluble sugar content in the lettuce treated with the light source of the present disclosure is 30%-50% higher than that using supplemental lighting with a red LED light source and a blue LED light source, under irradiation with the same light quantum flux densities, and the cost for the light source is reduced by more than half in the present disclosure.

Furthermore, the ratio of the flower diameter to the pedicel length of Chrysanthemum is the largest, the plant grows more robustly, the ornamental quality of Chrysanthemum is improved, and the flowering period is effectively controlled and thus the flower regularity is improved in the treatment using the light source of the present disclosure with R/FR=2.5 under irradiation with the same light quantum flux densities.

Embodiment 2

This embodiment provides an LED light source for supplemental lighting for plants, including a substrate, an LED chip, and a first glue powder layer.

The LED chip is any one selected from the group consisting of: semiconductor light emitting diode; organic light emitting diode (OLED); quantum dot light emitting diode (QLED); and micro light emitting diode (Micro-LED).

The LED chip is disposed on the substrate, and preferably, the substrate is a PCB. The LED chip is mounted on one surface of the substrate, and a heat dissipation device, such as a heat dissipation base and the other members, is mounted on the other surface of the substrate, to dissipate the heat generated during the operation of the LED chip, so that the LED chip maintains a better operation temperature and operates in a stable state, and thus has a long service life.

The LED chip may be a blue LED chip, that is, the LED chip is capable of generating blue light of 450 nm to 480 nm.

The LED chip is covered thereon with the first glue powder layer; in this embodiment, the LED chip is fixed on the substrate through the first glue powder layer which is a mixture of glue, red phosphors and yellow phosphors, wherein a weight ratio of the glue, the red phosphors, and the yellow phosphors is 100:10-100:10-30, and preferably, the weight ratio of the glue, the red phosphors, and the yellow phosphors may be 100:50:20. Namely, with the addition of red phosphor, blue light excites the red phosphors to emit red light, and with the addition of yellow phosphors, blue light excites yellow phosphors to emit green light and infrared light.

In this embodiment, control of the weight ratio of the glue, the red phosphors and the yellow phosphors in the first glue powder layer, as well as the thickness of the first glue powder layer allows the ratio of photon flux densities of red light (600 nm-680 nm):blue light (420 nm-480 nm):infrared light:green light:ultraviolet light to be 70-90:10-30:1-30:5-20:0.01-1.

In this embodiment, the thickness of the first glue powder layer can be 0.2 mm-1.4 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The yellow phosphor is one of yellow phosphors such as silicate yellow phosphor, aluminate yellow phosphor, nitride and oxynitride phosphors, or a combination thereof.

The red phosphor is one of YAGG, YAGG:$Ce^{3+}$, YAG:$Eu^{2+}$, nitride red phosphor, $Mn^{4+}$ doped $K_2SiF_6$ and $K_2SnF_6$ deep red phosphor, or a combination thereof.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Embodiment 3

This embodiment provides an LED light source for supplemental lighting for plants, of which a difference from Embodiment 1 is the use of infrared phosphors instead of yellow phosphors. Here, A weight ratio of the glue to the infrared phosphors is 100:10-30, and preferably, the weight ratio of the glue to the infrared phosphors is 100:25.

Namely, since infrared phosphors are incorporated as well as the infrared phosphors is excited by blue light, infrared light can be generated which has a wavelength of 700 nm to 760 nm and optimally 730 nm, and thereby the photomorphogenesis of plants is adjusted by infrared.

In this embodiment, control of the weight ratio of the glue to the red phosphors in the first glue powder layer, as well as the thickness of the first glue powder layer; and control of the weight ratio of the glue to the infrared phosphors in the second glue powder layer, as well as the thickness of the second glue powder layer allow the ratio of photon flux densities of red light (600 nm-680 nm):blue light (420 nm-480 nm):infrared light:green light:ultraviolet light to be 70-90:10-30:1-30:5-20:0.01-1.

Preferably, the thickness of the first glue powder layer can be 0.1 mm-0.5 mm, and the thickness of the second glue powder layer can be 0.1 mm-0.9 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The red phosphor is one of YAGG, YAGG:$Ce^{3+}$, YAG:$Eu^{2+}$, nitride red phosphor, $Mn^{4+}$ doped $K_2SiF_6$ and $K_2SnF_6$ deep red phosphor, or a combination thereof.

The infrared phosphor is one of $Cr^{3+}$, $Ce^{3+}$, and $Yb^{3+}$ multi-doped YAG near infrared phosphors, or a combination thereof, such as $Y_3Al_5O_{12}$:Cr,Ce,Yb.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Embodiment 4

This embodiment provides an LED light source for supplemental lighting for plants, of which a difference from Embodiment 2 is the use of infrared phosphors instead of yellow phosphors. Here, a weight ratio of the glue, the red phosphors, and the infrared phosphors is 100:10-100:10-40, and preferably, the weight ratio of the glue, the red phosphors, and the infrared phosphors may be 100:50:20. Namely, with the addition of red phosphors, blue light excites the red phosphors to emit red light, and with the addition of infrared phosphors, blue light excites infrared phosphors to emit infrared light with a wavelength of 700 nm-760 nm and optimally 730 nm.

In this embodiment, control of the weight ratio of the glue, the red phosphors and the infrared phosphors in the first glue powder layer, as well as the thickness of the first glue powder layer allows the ratio of photon flux densities of red light (600 nm-680 nm):blue light (420 nm-480 nm):infrared light:green light:ultraviolet light to be 70-90:10-30:1-30:5-20:0.01-1.

In this embodiment, the thickness of the first glue powder layer can be 0.2 mm-1.4 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The red phosphor is one of YAGG, YAGG:$Ce^{3+}$, YAG:$Eu^{2+}$, nitride red phosphor, $Mn^{4+}$ doped $K_2SiF_6$ and $K_2SnF_6$ deep red phosphor, or a combination thereof. The infrared phosphor is one of $Cr^{3+}$, $Ce^{3+}$, and $Yb^{3+}$ multi-doped YAG near infrared phosphors, or a combination thereof, such as $Y_3Al_5O_{12}$:Cr,Ce,Yb.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Embodiment 5

This embodiment provides a lamp, including the LED light source for supplemental lighting for plants of Embodiments 1 to 4.

In addition, the lamp further includes an electrical connector and an LED driver; and the LED light sources for supplemental lighting for plants can be connected in series, in parallel, or in series and parallel.

The PCB board is provided thereon with an insulating layer and a conductive circuit, and the conductive circuit is connected to an anode and a cathode of the LED chip through a lead, so as to realize the circuit connection of the LED chip.

The conductive circuit is connected to an output of the LED driver; and the LED driver is used to drive the LED light sources for supplemental lighting for plants.

The PCB is a strip-shaped PCB, a rectangular PCB, or a disc-shaped PCB, and may adopt one of aluminum nitride, copper substrate, copper alloy substrate, alumina, epoxy resin molding compound, silicon carbide, diamond, silicon, Graphite aluminum substrate, aluminum-iron alloy substrate, highly thermally conductive plastic substrate, and aluminum-coated plastic substrate.

Embodiment 6

This embodiment provides an LED device for supplemental lighting for plants, including a substrate, an LED chip, a first glue powder layer, and a second glue powder layer.

The LED chip is any one selected from the group consisting of: semiconductor light emitting diode; organic light emitting diode (OLED); quantum dot light emitting diode (QLED); and micro light emitting diode (Micro-LED).

The LED chip is disposed on the substrate, and preferably, the substrate is a PCB. The LED chip is mounted on one surface of the substrate, and a heat dissipation device, such as a heat dissipation base and the other members, is mounted on the other surface of the substrate, to dissipate the heat generated during the operation of the LED chip, so that the LED chip maintains a better operation temperature and operates in a stable state, and thus has a long service life.

The LED chip includes one of a blue LED chip and an ultraviolet LED chip, or a combination thereof, that is, the LED chip is capable of generating blue light with a wavelength of 400 nm to 480 nm and near ultraviolet light with a wavelength of 320 nm to 400 nm.

The LED chip is covered thereon with the first glue powder layer and the second glue powder layer; in this embodiment, the LED chip is fixed on the substrate through the first glue powder layer which is a mixture of glue and red phosphors, wherein a weight ratio of the glue to the red phosphors is 100:10-150, and a weight ratio of 100:50 or 100:100 can be selected as a preferred embodiment.

The red phosphors are excited by blue light and the ultraviolet light emitted by the LED chip to emit red light with a luminescence peak falling in a wavelength range of 605 nm to 680 nm.

The second glue powder layer covers the first glue powder layer and completely wraps the first glue powder layer; in this embodiment, the second glue powder layer is a mixture of glue and red phosphors, wherein a weight ratio of the glue to the infrared phosphors is 100:10-40, and preferably, the weight ratio of the glue to the infrared phosphors is 100:25.

Namely, since infrared phosphors are incorporated as well as the infrared phosphors is excited by blue light and ultraviolet light, infrared light can be generated which has a wavelength of 700 nm to 760 nm and optimally 730 nm, and thereby the photomorphogenesis of plants is adjusted.

In this embodiment, control of the weight ratio of the glue to the red phosphors in the first glue powder layer, as well as the thickness of the first glue powder layer; and control of the weight ratio of the glue to the infrared phosphors in the second glue powder layer, as well as the thickness of the second glue powder layer allow the ratio of photon flux densities of red light (600 nm-700 nm):blue light (400 nm-470 nm):infrared light:green light:ultraviolet light to be 70-90:10-30:0.05-5:5-20:0.01-5.

Preferably, the thickness of the first glue powder layer can be 0.1 mm-0.5 mm, and the thickness of the second glue powder layer can be 0.1 mm-0.9 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The ultraviolet LED chip is one having a luminescence peak in a range of 320 nm to 400 nm, or is a combination of multi-wavelength violet LED chips with a luminescence peak in a range of 320 nm to 400 nm.

The red phosphor is one of YAGG, YAGG:$Ce^{3+}$, YAG:$Eu^{2+}$, nitride red phosphor, $Mn^{4+}$ doped $K_2SiF_6$ and $K_2SnF_6$ deep red phosphor, or a combination thereof.

The infrared phosphor is one of $Cr^{3+}$, $Ce^{3+}$, and $Yb^{3+}$ multi-doped YAG near infrared phosphors, or a combination thereof, such as $Y_3Al_5O_{12}$:Cr,Ce,Yb.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Compared with the prior art, the red phosphors and infrared phosphors are excited by the blue LED chip and the ultraviolet LED chip, which not only allows formation of a full spectrum, but also outstands the light formulation of spectrum for photosynthesis, and the UV component of the spectrum is increased when the number of UV LED chips are increased, these are particularly suitable cultivation of medicinal plants. Thereby, the light formulation achieved by a combination of multiple LED chips such as a red LED chip, a blue LED chip, an infrared LED chip, an ultraviolet LED chip, and a green LED chip in the prior art is changed. Consequently, input cost for LED chips, circuit and heat dissipation device is greatly reduced (the price of the red LED chip, infrared LED chip, and green LED chip is much higher than that of the blue LED chip, and their luminous efficiency is very low).

In addition, the light formulation of the LED device for supplemental lighting for plants according to the present disclosure is more uniform, and the beam angle of the light source is small. However, an LED for supplemental lighting for plants in the prior art, in which a large numbers of red LED chips and a small numbers of infrared LED chips and green LED chips are used, is difficult to achieve uniform distribution of light qualities.

The LED device for supplemental lighting for plants according to the present disclosure has a longer service life and lower cost for heat dissipation. The red phosphors and infrared phosphors are excited by the blue LED chip and ultraviolet LED chip, rather than use of red LED chips, infrared LED chips, and green LED chips, thereby reducing greatly power of light source for plant growth. In addition, the circuit design is simplified (The different operating voltage drops of the blue LED, red LED chip, infrared LED chip, and green LED chip make the circuit complicated. Only the blue LED chip is used to excite the red phosphors, and infrared phosphors to achieve the required spectrum, and thereby the circuit design is simplified.), the amount of capacitors used is reduced, the cost for circuit is low, and the service life is greatly extended.

The light source according to the present disclosure in which the red phosphors and infrared phosphors are excited by the blue LED chip and ultraviolet LED chip was used as a light formulation to irradiate lettuce. The result shows that: The soluble sugar content in the lettuce treated with the light source of the present disclosure is 30%-50% higher than that using supplemental lighting with a red LED light source and a blue LED light source, under irradiation with the same light quantum flux densities, and the cost for the light source is reduced by more than half in the present disclosure.

Furthermore, the ratio of the flower diameter to the pedicel length of Chrysanthemum is the largest, the plant grows more robustly, the ornamental quality of Chrysanthemum is improved, and the flowering period is effectively controlled and thus the flower regularity is improved in the treatment using the light source of the present disclosure with R/FR=2.5 under irradiation with the same light quantum flux densities.

Embodiment 7

This embodiment provides an LED device for supplemental lighting for plants, including a substrate, an LED chip, and a first glue powder layer.

The LED chip is any one selected from the group consisting of: semiconductor light emitting diode; organic light emitting diode (OLED); quantum dot light emitting diode (QLED); and micro light emitting diode (Micro-LED).

The LED chip is disposed on the substrate, and preferably, the substrate is a PCB. The LED chip is mounted on one surface of the substrate, and a heat dissipation device, such as a heat dissipation base and the other members, is mounted on the other surface of the substrate, to dissipate the heat generated during the operation of the LED chip, so that the LED chip maintains a better operation temperature and operates in a stable state, and thus has a long service life.

The LED chip includes one of a blue LED chip and an ultraviolet LED chip, or a combination thereof, that is, the LED chip is capable of generating blue light of 400 nm to 480 nm and ultraviolet light with a luminescence peak of 320 nm to 400 nm.

The LED chip is covered thereon with the first glue powder layer; in this embodiment, the LED chip is fixed on the substrate through the first glue powder layer which is a mixture of glue, red phosphors, and infrared phosphors, wherein a weight ratio of the glue, the red phosphors, and the infrared phosphors is 100:10-100:10-40, and preferably, the weight ratio of the glue, the red phosphors, and the infrared phosphors may be 100:50:20. Namely, with the addition of red phosphor, blue light and ultraviolet light excite the red phosphors to emit red light, and with the addition of infrared phosphors, blue light and ultraviolet light excite infrared phosphors to emit infrared light.

In this embodiment, control of the weight ratio of the glue, the red phosphors, and the infrared phosphors in the first glue powder layer, as well as the thickness of the first glue powder layer allows the ratio of photon flux densities of red light (600 nm-700 nm):blue light (400 nm-470 nm):infrared light:green light:ultraviolet light to be 70-90:10-30:0.05-5: 5-20:0.01-5.

Preferably, the thickness of the first glue powder layer can be 0.1 mm-0.5 mm, and the thickness of the second glue powder layer can be 0.1 mm-0.9 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm. The ultraviolet LED chip is one having a luminescence peak in a range of 320 nm to 400 nm, or is a combination of multi-wavelength violet LED chips with a luminescence peak in a range of 320 nm to 400 nm.

The yellow phosphor is one of yellow phosphors such as silicate yellow phosphor, aluminate yellow phosphor, nitride and oxynitride phosphors, or a combination thereof.

The red phosphor is one of YAGG, YAGG:$Ce^{3+}$, YAG: $Eu^{2+}$, nitride red phosphor, $Mn^{4+}$ doped $K_2SiF_6$ and $K_2SnF_6$ deep red phosphor, or a combination thereof.

The infrared phosphor is one of $Cr^{3+}$, $Ce^{3+}$, and $Yb^{3+}$ multi-doped YAG near infrared phosphors, or a combination thereof, such as $Y_3Al_5O_{12}$:Cr,Ce,Yb.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Embodiment 8

This embodiment provides an LED device for supplemental lighting for plants, of which a difference from Embodiment 6 is the use of yellow phosphors instead of infrared phosphors. Here, A weight ratio of the glue to the yellow phosphors is 100:10-40, and preferably, the weight ratio of the glue to the yellow phosphors is 100:25.

Namely, since yellow phosphors are incorporated as well as the yellow phosphors is excited by blue light and ultraviolet light, green light and infrared light can be generated in which the infrared light has a wavelength of 700 nm to 760 nm and optimally 730 nm, and thus the photomorphogenesis of plants is adjusted by infrared.

In this embodiment, control of the weight ratio of the glue to the red phosphors in the first glue powder layer, as well as the thickness of the first glue powder layer; and control of the weight ratio of the glue to the yellow phosphors in the second glue powder layer, as well as the thickness of the second glue powder layer allow the ratio of photon flux densities of red light (600 nm-700 nm):blue light (400 nm-470 nm):infrared light:green light:ultraviolet light to be 70-90:10-30:0.05-5:5-20:0.01-5.

Preferably, the thickness of the first glue powder layer can be 0.1 mm-0.5 mm, and the thickness of the second glue powder layer can be 0.1 mm-0.9 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The yellow phosphor is one of yellow phosphors such as silicate yellow phosphor, aluminate yellow phosphor, nitride and oxynitride phosphors, or a combination thereof.

The red phosphor is one of YAGG, YAGG:$Ce^{3+}$, YAG:$Eu^{2+}$, nitride red phosphor, $Mn^{4+}$ doped $K_2SiF_6$ and $K_2SnF_6$ deep red phosphor, or a combination thereof.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Embodiment 9

This embodiment provides an LED device for supplemental lighting for plants, of which a difference from Embodiment 7 is the use of yellow phosphors instead of infrared phosphors. Here, A weight ratio of the glue, the red phosphors, and the yellow phosphors is 100:10-100:10-40, and preferably, the weight ratio of the glue, the red phosphors, and the yellow phosphors may be 100:50:20. Namely, with the addition of yellow phosphors, blue light and the ultraviolet light excite red phosphors to emit red light, and with the addition of yellow phosphors, blue light and ultraviolet light excite yellow phosphors to emit green light and infrared light, the infrared light having a wavelength of 700 nm-760 nm and optimally 730 nm.

In this embodiment, control of the weight ratio of the glue, the red phosphors, and the infrared phosphors in the first glue powder layer, as well as the thickness of the first glue powder layer allows the ratio of photon flux densities of red light (600 nm-700 nm):blue light (400 nm-470 nm):infrared light:green light:ultraviolet light to be 70-90:10-30:0.05-5: 5-20:0.01-5.

In this embodiment, the thickness of the first glue powder layer can be 0.2 mm-1.4 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The yellow phosphor is one of yellow phosphors such as silicate yellow phosphor, aluminate yellow phosphor, nitride and oxynitride phosphors, or a combination thereof.

The red phosphor is one of YAGG, YAGG:$Ce^{3+}$, YAG:$Eu^{2+}$, nitride red phosphor, $Mn^{4+}$ doped $K_2SiF_6$ and $K_2SnF_6$ deep red phosphor, or a combination thereof.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Embodiment 10

This embodiment provides a lamp, including the LED device for supplemental lighting for plants of Embodiments 6 to 9.

In addition, the lamp further includes an electrical connector and an LED driver; and the LED devices for supplemental lighting for plants can be connected in series, in parallel, or in series and parallel.

An insulating layer and a conductive circuit are arranged on the PCB, and one or more LED chips of the LED devices for supplemental lighting for plants are welded on the conductive circuit.

The conductive circuit is connected to an output of the LED driver; and the LED driver is used to drive the LED devices for supplemental lighting for plants.

The PCB is a strip-shaped PCB, a rectangular PCB, an annular PCB, or a disc-shaped PCB, and the substrate is one of aluminum nitride, copper substrate, copper alloy substrate, alumina, epoxy resin molding compound, silicon carbide, diamond, silicon, Graphite aluminum substrate, aluminum-iron alloy substrate, highly thermally conductive plastic substrate, and aluminum-coated plastic substrate.

Embodiment 11

This embodiment provides an upside-down type LED light source for supplemental lighting for plants, including a substrate, an LED chip, a first glue powder layer, and a second glue powder layer.

The LED chip is any one selected from the group consisting of: semiconductor light emitting diode; organic light emitting diode (OLED); quantum dot light emitting diode (QLED); and micro light emitting diode (Micro-LED).

The LED chip is disposed on the substrate, and preferably, the substrate is a PCB. The LED chip is mounted on one surface of the substrate, and a heat dissipation device, such as a heat dissipation base and the other members, is mounted on the other surface of the substrate, to dissipate the heat generated during the operation of the LED chip, so that the LED chip maintains a better operation temperature and operates in a stable state, and thus has a long service life.

The LED chip may be a blue LED chip, that is, the LED chip is capable of generating blue light of 400 nm to 480 nm.

The first glue powder layer is disposed between the LED chip and the substrate, and the LED chip is covered thereon with the second glue powder layer; in this embodiment, the LED chip is fixed on the substrate through the first glue powder layer which is a mixture of glue and red phosphors.

The second glue powder layer covers the LED chip and completely wraps the LED chip; in this embodiment, the second glue powder layer is a mixture of glue and yellow phosphors.

Alternatively, the first glue powder layer is a mixture of glue and yellow phosphors, and the second glue powder layer is a mixture of glue and red phosphors.

A weight ratio of the glue to the red phosphors is 100:10-150, and a weight ratio of 100:50 or 100:100 can be selected as a preferred embodiment.

The red phosphors are excited by blue light emitted by the LED chip to emit red light with a luminescence peak falling in a red light wavelength range of 605 nm to 680 nm.

A weight ratio of the glue to the yellow phosphors is 100:10-30, and preferably, the weight ratio of the glue to the yellow phosphors is 100:20.

Namely, since yellow phosphors are incorporated as well as the yellow phosphors is excited by blue light, green light with a wavelength of 500 nm to 560 nm and infrared light can be generated. Green light is capable of adjusting visual effect and photosynthesis, and infrared light is capable of adjusting the photomorphogenesis of plants.

In this embodiment, control of the weight ratio of the glue to the red phosphors in the first glue powder layer, as well as the thickness of the first glue powder layer; and control of the weight ratio of the glue to the yellow phosphors in the second glue powder layer, as well as the thickness of the second glue powder layer allow the ratio of photon flux densities of red light (600 nm-680 nm):blue light (420 nm-480 nm):infrared light:green light:ultraviolet light to be 70-90:10-30:1-30:5-20:0.01-1.

Preferably, the thickness of the first glue powder layer can be 0.1 mm-0.5 mm, and the thickness of the second glue powder layer can be 0.1 mm-0.9 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The yellow phosphor is one of yellow phosphors such as silicate yellow phosphor, aluminate yellow phosphor, nitride and oxynitride phosphors, or a combination thereof.

The red phosphor is one of YAGG, YAGG:$Ce^{3+}$, YAG:$Eu^{2+}$, nitride red phosphor, $Mn^{4+}$ doped $K_2SiF_6$ and $K_2SnF_6$ deep red phosphor, or a combination thereof.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Compared with the prior art, the combination of red phosphors and yellow phosphors is excited by the blue LED chip, which not only allows formation of a full spectrum, but also outstands the light formulation of characteristic for photosynthesis of plants, thereby changing the light formulation achieved by a combination of multiple LED chips such as a red LED chip, a blue LED chip, an infrared LED chip, an ultraviolet LED chip, and a green LED chip in the prior art. Consequently, input cost for LED chips, circuit and heat dissipation device is greatly reduced (the price of the red LED chip, infrared LED chip, and green LED chip is much higher than that of the blue LED chip, and their luminous efficiency is very low);

In addition, the light formulation of the upside-down type LED light source for supplemental lighting for plants according to the present disclosure is more uniform, and the beam angle of the light source is controllable. However, an LED for supplemental lighting for plants in the prior art, in which a large numbers of red LED chips and a small numbers of infrared LED chips and green LED chips are used, is difficult to achieve uniform distribution of light qualities.

The upside-down type LED light source for supplemental lighting for plants according to the present disclosure has a longer service life and lower cost for heat dissipation. The combination of red phosphors and yellow phosphors is excited by the blue LED chip, rather than use of red LED chips, infrared LED chips, and green LED chips, thereby reducing greatly power of light source for plant growth. In addition, the circuit design is simplified (The different operating voltage drops of the blue LED, red LED chip, infrared LED chip, and green LED chip make the circuit complicated. Only the blue LED chip is used to excite the red phosphors, yellow phosphors, and infrared phosphors to achieve the required spectrum, and thereby the circuit design is simplified.), the amount of capacitors used is reduced, the cost for circuit is low, and the service life is greatly extended.

The light source according to the present disclosure in which the red phosphors and yellow phosphors are excited by the blue LED chip was used as a light formulation to irradiate lettuce. The result shows that: The soluble sugar content in the lettuce treated with the light source of the present disclosure is 30%-50% higher than that using supplemental lighting with a red LED light source and a blue LED light source, under irradiation with the same light quantum flux densities, and the cost for the light source is reduced by more than half in the present disclosure.

Furthermore, the ratio of the flower diameter to the pedicel length of Chrysanthemum is the largest, the plant grows more robustly, the ornamental quality of Chrysanthemum is improved, and the flowering period is effectively controlled and thus the flower regularity is improved in the treatment using the light source of the present disclosure with R/FR=2.5 under irradiation with the same light quantum flux densities.

Embodiment 12

This embodiment provides an upside-down type LED light source for supplemental lighting for plants, of which a difference from Embodiment 11 is the use of infrared phosphors instead of yellow phosphors. Here, A weight ratio of the glue to the infrared phosphors is 100:10-30, and preferably, the weight ratio of the glue to the infrared phosphors is 100:25.

Namely, since infrared phosphors are incorporated as well as the infrared phosphors is excited by blue light, infrared light can be generated which has a wavelength of 700 nm to 760 nm and optimally 730 nm, and thereby the photomorphogenesis of plants is adjusted by infrared.

In this embodiment, control of the weight ratio of the glue to the red phosphors in the first glue powder layer, as well as the thickness of the first glue powder layer and control of the weight ratio of the glue to the infrared phosphors in the second glue powder layer, as well as the thickness of the second glue powder layer allow the ratio of photon flux densities of red light (600 nm-680 nm):blue light (420 nm-480 nm):infrared light:green light:ultraviolet light to be 70-90:10-30:1-30:5-20:0.01-1.

Preferably, the thickness of the first glue powder layer can be 0.1 mm-0.5 mm, and the thickness of the second glue powder layer can be 0.1 mm-0.9 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The red phosphor is one of YAGG, YAGG:$Ce^{3+}$, YAG:$Eu^{2+}$, nitride red phosphor, $Mn^{4+}$ doped $K_2SiF_6$ and $K_2SnF_6$ deep red phosphor, or a combination thereof.

The infrared phosphor is one of $Cr^{3+}$, $Ce^{3+}$, and $Yb^{3+}$ multi-doped YAG near infrared phosphors, or a combination thereof, such as $Y_3Al_5O_{12}$:Cr,Ce,Yb.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Embodiment 13

This embodiment provides a lamp, including the upside-down type LED light source for supplemental lighting for plants of Embodiments 11 to 12.

In addition, the lamp further includes an electrical connector and an LED driver; and the upside-down type LED light sources for supplemental lighting for plants can be connected in series, in parallel, or in series and parallel.

An insulating layer and a conductive circuit are arranged on the PCB, and one or more upside-down type LED chips of the LED light sources for supplemental lighting for plants are welded on the conductive circuit.

The conductive circuit is connected to an output of the LED driver; and the LED driver is used to drive the upside-down type LED light sources for supplemental lighting for plants.

The PCB is a strip-shaped PCB, a rectangular PCB, or a disc-shaped PCB, and may be prepared using one of aluminum nitride, copper substrate, copper alloy substrate, alumina, epoxy resin molding compound, silicon carbide, diamond, silicon, Graphite aluminum substrate, aluminum-iron alloy substrate, highly thermally conductive plastic substrate, and aluminum-coated plastic substrate.

Embodiment 14

This embodiment provides an upside-down type LED device for supplemental lighting for plants, including a substrate, an LED chip, a first glue powder layer, and a second glue powder layer.

The LED chip is any one selected from the group consisting of: semiconductor light emitting diode; organic light emitting diode (OLED); quantum dot light emitting diode (QLED); and micro light emitting diode (Micro-LED).

The LED chip is disposed on the substrate, and preferably, the substrate is a PCB. The LED chip is mounted on one surface of the substrate, and a heat dissipation device, such as a heat dissipation base and the other members, is mounted on the other surface of the substrate, to dissipate the heat generated during the operation of the LED chip, so that the LED chip maintains a better operation temperature and operates in a stable state, and thus has a long service life.

The LED chip includes one of a blue LED chip and an ultraviolet LED chip, or a combination thereof, that is, the LED chip is capable of generating blue light with a wavelength of 400 nm to 480 nm and near ultraviolet light with a wavelength of 320 nm to 400 nm.

The first glue powder layer is disposed between the LED chip and the substrate, and the LED chip is covered thereon with the second glue powder layer; in this embodiment, the LED chip is fixed on the substrate through the first glue powder layer which is a mixture of glue and red phosphors, wherein a weight ratio of the glue to the red phosphors is 100:10-150, and a weight ratio of 100:50 can be selected as a preferred embodiment.

The red phosphors are excited by blue light and the ultraviolet light emitted by the LED chip to emit red light with a luminescence peak falling in a wavelength range of 605 nm to 680 nm.

The second glue powder layer completely wraps the LED chip; in this embodiment, the second glue powder layer is a mixture of glue and infrared phosphors, wherein a weight ratio of the glue to the infrared phosphors is 100:10-40, and preferably, the weight ratio of the glue to the infrared phosphors is 100:25.

Namely, since infrared phosphors are incorporated as well as the infrared phosphors is excited by blue light and ultraviolet light, infrared light can be generated which has a wavelength of 700 nm to 760 nm and optimally 730 nm, and thereby the photomorphogenesis of plants is adjusted.

In this embodiment, control of the weight ratio of the glue to the red phosphors in the first glue powder layer, as well as the thickness of the first glue powder layer; and control of the weight ratio of the glue to the infrared phosphors in the second glue powder layer, as well as the thickness of the second glue powder layer allow the ratio of photon flux densities of red light (600 nm-700 nm):blue light (400 nm-470 nm):infrared light:green light:ultraviolet light to be 70-90:10-30:0.05-5:5-20:0.01-5.

Preferably, the thickness of the first glue powder layer can be 0.1 mm-0.5 mm, and the thickness of the second glue powder layer can be 0.1 mm-0.9 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The yellow phosphor is one of yellow phosphors such as silicate yellow phosphor, aluminate yellow phosphor, nitride and oxynitride phosphors, or a combination thereof.

The red phosphor is one of YAGG, YAGG:$Ce^{3+}$, YAG:$Eu^{2+}$, nitride red phosphor, $Mn^{4+}$ doped $K_2SiF_6$ and $K_2SnF_6$ deep red phosphor, or a combination thereof.

The infrared phosphor is one of $Cr^{3+}$, $Ce^{3+}$, and $Yb^{3+}$ multi-doped YAG near infrared phosphors, or a combination thereof, such as $Y_3Al_5O_{12}$:Cr,Ce,Yb.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Compared with the prior art, the red phosphors and infrared phosphors are excited by the blue LED chip and the ultraviolet LED chip, which not only allows formation of a full spectrum, but also outstands the light formulation of spectrum for photosynthesis and the UV component of the spectrum is increased when the number of UV LED chips are increased, these are particularly suitable cultivation of medicinal plants. Thereby, the light formulation achieved by a combination of multiple LED chips such as a red LED chip, a blue LED chip, an infrared LED chip, an ultraviolet LED chip, and a green LED chip in the prior art is changed. Consequently, input cost for LED chips, circuit and heat dissipation device is greatly reduced (the price of the red LED chip, infrared LED chip, and green LED chip is much higher than that of the blue LED chip, and their luminous efficiency is very low).

In addition, the light formulation of the upside-down type LED device for supplemental lighting for plants according to the present disclosure is more uniform, and the beam angle of the light source is small. However, an LED for supplemental lighting for plants in the prior art, in which a large numbers of red LED chips and a small numbers of infrared LED chips and green LED chips are used, is difficult to achieve uniform distribution of light qualities.

The upside-down type LED device for supplemental lighting for plants according to the present disclosure has a longer service life and lower cost for heat dissipation. The red phosphors and infrared phosphors are excited by the blue LED chip and ultraviolet LED chip, rather than use of red LED chips, infrared LED chips, and green LED chips, thereby reducing greatly power of light source for plant growth. In addition, the circuit design is simplified (The different operating voltage drops of the blue LED, red LED chip, infrared LED chip, and green LED chip make the circuit complicated. Only the blue LED chip is used to excite the red phosphors, yellow phosphors, and infrared phosphors to achieve the required spectrum, and thereby the circuit design is simplified.), the amount of capacitors used is reduced, the cost for circuit is low, and the service life is greatly extended.

The light source according to the present disclosure in which the red phosphors and infrared phosphors are excited by the blue LED chip and ultraviolet LED chip was used as a light formulation to irradiate lettuce. The result shows that: The soluble sugar content in the lettuce treated with the light source of the present disclosure is 30%-50% higher than that using supplemental lighting with a red LED light source and a blue LED light source, under irradiation with the same light quantum flux densities, and the cost for the light source is reduced by more than half in the present disclosure.

Furthermore, the ratio of the flower diameter to the pedicel length of Chrysanthemum is the largest, the plant grows more robustly, the ornamental quality of Chrysanthemum is improved, and the flowering period is effectively controlled and thus the flower regularity is improved in the treatment using the light source of the present disclosure with R/FR=2.5 under irradiation with the same light quantum flux densities.

Embodiment 15

This embodiment provides an upside-down type LED device for supplemental lighting for plants, of which a difference from Embodiment 14 is the use of yellow phosphors instead of infrared phosphors. Here, A weight ratio of the glue to the yellow phosphors is 100:10-40, and preferably, the weight ratio of the glue to the yellow phosphors is 100:25.

Namely, since yellow phosphors are incorporated as well as the yellow phosphors are excited by blue light and ultraviolet light, green light and infrared light can be generated in which the infrared light has a wavelength of 700 nm to 760 nm and optimally 730 nm, and thus the photomorphogenesis of plants is adjusted by infrared.

In this embodiment, control of the weight ratio of the glue to the red phosphors in the first glue powder layer, as well as the thickness of the first glue powder layer; and control of the weight ratio of the glue to the yellow phosphors in the second glue powder layer, as well as the thickness of the second glue powder layer allow the ratio of photon flux densities of red light (600 nm-700 nm):blue light (400 nm-470 nm):infrared light:green light:ultraviolet light to be 70-90:10-30:0.05-5:5-20:0.01-5.

Preferably, the thickness of the first glue powder layer can be 0.1 mm-0.5 mm, and the thickness of the second glue powder layer can be 0.1 mm-0.9 mm, so that the ratio of photon flux densities is within the above range.

The blue LED chip has a luminescence peak in a range of 400 nm to 480 nm, or is a combination of multi-wavelength blue LED chips with a luminescence peak in a range of 400 nm to 480 nm.

The yellow phosphor is one of yellow phosphors such as silicate yellow phosphor, aluminate yellow phosphor, nitride and oxynitride phosphors, or a combination thereof.

The red phosphor is one of YAGG, YAGG:Ce$^{3+}$, YAG: Eu$^{2+}$, nitride red phosphor, Mn$^{4+}$ doped $K_2SiF_6$ and $K_2SnF_6$ deep red phosphor, or a combination thereof.

The glue is one of silica gel, epoxy resin, polymethyl methacrylate (PMMA), polycarbonate (PC), and photosensitive colloid, or a combination thereof. Depending on different needs, corresponding glues are used in the die bonding process and potting process.

Embodiment 16

This embodiment provides a lamp, including the upside-down type LED device for supplemental lighting for plants of Embodiments 14 to 15.

In addition, the lamp further includes an electrical connector and an LED driver; and the upside-down type LED devices for supplemental lighting for plants can be connected in series, in parallel, or in series and parallel.

An insulating layer and a conductive circuit are arranged on the PCB, and one or more LED chips of the LED devices for supplemental lighting for plants are welded on the conductive circuit.

The conductive circuit is connected to an output of the LED driver; and the LED driver is used to drive the upside-down type LED light sources for supplemental lighting for plants.

The PCB is a strip-shaped PCB, a rectangular PCB, or a disc-shaped PCB, and may be prepared using one material of aluminum nitride, copper substrate, copper alloy substrate, alumina, epoxy resin molding compound, silicon carbide, diamond, silicon, Graphite aluminum substrate, aluminum-iron alloy substrate, highly thermally conductive plastic substrate, and aluminum-coated plastic substrate.

What is claimed is:

1. An upside-down type LED light source for supplemental lighting for plants, wherein the upside-down type LED light source comprises a substrate, an LED chip, a first glue powder layer, and a second glue powder layer;
   the LED chip is mounted on one surface of the substrate;
   the LED chip is a blue LED chip;
   the first glue powder layer is disposed between the LED chip and the substrate, and the LED chip is covered by the second glue powder layer;
   the LED chip is fixed on the substrate through the first glue powder layer, wherein the first glue powder is a mixture of a glue and red phosphors; and
   the second glue powder layer covers the LED chip and completely wraps the LED chip; the second glue powder layer is one of a mixture of the glue and yellow phosphors, and a mixture of the glue and infrared phosphors,
   wherein a thickness of the first glue powder layer is 0.1 mm-0.5 mm, and a thickness of the second glue powder layer is 0.1 mm-0.9 mm, so that a ratio of photon flux densities of red light of 600 nm-680 nm, blue light of 420 nm-480 nm, infrared light, green light, and ultraviolet light is in a range of (70-90):(10-30):(1-30):(5-20):(0.01-1).

2. The upside-down type LED light source for supplemental lighting for plants according to claim 1, wherein a weight ratio of the glue to the red phosphors is 100:10-150.

3. The upside-down type LED light source for supplemental lighting for plants according to claim 1, wherein a weight ratio of the glue to the yellow phosphors is 100:10-30.

4. The upside-down type LED light source for supplemental lighting for plants according to claim 1, wherein a weight ratio of the glue to the infrared phosphors is 100:10-40.

5. The upside-down type LED light source for supplemental lighting for plants according to claim 1, wherein the blue LED chip is one of the LED chip having a luminescence peak in a range of 400 nm to 480 nm, and a combination of multi-wavelength blue LED chips with a luminescence peak in the range of 400 nm to 480 nm.

6. A lamp, comprising the upside-down type LED light source for supplemental lighting for the plants according to claim 1.

7. The lamp according to claim 6, wherein a weight ratio of the glue to the red phosphors is 100:10-150.

8. The lamp according to claim 6, wherein a weight ratio of the glue to the infrared phosphors is 100:10-40.

9. The lamp according to claim 6, wherein a weight ratio of the glue to the yellow phosphors is 100:10-40.

10. The lamp according to claim 6, wherein the blue LED chip is one of the LED chip having a luminescence peak in a range of 400 nm to 480 nm, and a combination of multi-wavelength blue LED chips with a luminescence peak in the range of 400 nm to 480 nm; and the ultraviolet LED chip is the LED chip having a luminescence peak in a wavelength range of 320 nm to 400 nm.

11. An upside-down type LED device for supplemental lighting for plants, wherein the upside-down type LED device comprises a substrate, an LED chip, a first glue powder layer, and a second glue powder layer;
the LED chip is mounted on one surface of the substrate; the LED chip comprising at least one selected from the list consisting of a blue LED chip, an ultraviolet LED chip, and a combination of the blue LED chip and the ultraviolet LED chip;
the first glue powder layer is disposed between the LED chip and the substrate, and the LED chip is covered by the second glue powder layer;
the LED chip is fixed on the substrate through the first glue powder layer, wherein the first glue powder layer is a mixture of a glue and infrared phosphors, of a mixture of the glue and yellow phosphors; and
the second glue powder layer covers the LED chip and completely wraps the LED chip; the second glue powder layer being a mixture of the glue and red phosphors,
wherein a thickness of the first glue powder layer is 0.1 mm-0.5 mm, and a thickness of the second glue powder layer is 0.1 mm-0.9 mm, so that a ratio of photon flux densities of red light of 600 nm-580 nm, blue light of 420 nm-480 nm, infrared light, green light, and ultraviolet light is in a range of (70-90):(10-30):(1-30):(5-20):(0.01-1).

12. The upside-down type LED device for supplemental lighting, for plants according to claim 11, wherein a weight ratio of the glue to the red phosphors is 100:10-150.

13. The upside-down type LED device for supplemental lighting for plants according to claim 11, wherein a weight ratio of the glue to the infrared phosphors is 100:10-40.

14. The upside-down type LED device for supplemental lighting for plants according to claim 11, wherein a weight ratio of the glue to the yellow phosphors is 100:10-40.

15. The upside-down type LED device for supplemental lighting for plants according to claim 11, wherein the blue LED chip is one of the LED chip having a luminescence peak in a range of 400 nm to 480 nm, and a combination of multi-wavelength blue LED chips with a luminescence peak in the range of 400 nm to 480 nm; and the ultraviolet LED chip is the LED chip having a luminescence peak in a wavelength range of 320 nm to 400 nm.

16. A lamp, comprising the upside-down type LED light device for supplemental lighting for the plants according to claim 11.

17. The lamp according to claim 16, wherein a weight ratio of the glue to the red phosphors is 100:10-450.

18. The lamp according to claim 16, wherein a weight ratio of the glue to the infrared phosphors is 100:10-40.

19. The lamp according to claim 16, wherein a weight ratio of the glue to the yellow phosphors is 100:10-40.

* * * * *